(12) United States Patent
Huo et al.

(10) Patent No.: US 7,274,066 B2
(45) Date of Patent: Sep. 25, 2007

(54) SEMICONDUCTOR MEMORY DEVICES AND METHODS OF FABRICATING THE SAME

(75) Inventors: Zong-Liang Huo, Suwon-si (KR); Seung-Jae Baik, Hwaseong-si (KR); In-Seok Yeo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/233,334

(22) Filed: Sep. 22, 2005

(65) Prior Publication Data

US 2006/0060914 A1 Mar. 23, 2006

(30) Foreign Application Priority Data

Sep. 23, 2004 (KR) ...................... 10-2004-0076665

(51) Int. Cl.
*H01L 29/788* (2006.01)
(52) U.S. Cl. .................. 257/315; 257/321; 257/E21.68
(58) Field of Classification Search ................ 257/303, 257/304, 306, 307, 311, 314, 316, 315, 321; 438/258, 266, 396
See application file for complete search history.

(56) References Cited

U.S. PATENT DOCUMENTS 5,952,692 A 9/1999 Nakazato et al. ........... 257/321

6,475,857 B1 * 11/2002 Kim et al. .................. 438/240

FOREIGN PATENT DOCUMENTS

KR 10-2004-0040691 5/2004

* cited by examiner

*Primary Examiner*—Quoc Hoang
(74) *Attorney, Agent, or Firm*—Mills & Onello LLP

(57) ABSTRACT

There are provided highly integrated semiconductor memory devices being suitable for storing two bits of data in one unit cell, and methods of fabricating the same. The unit cell of the semiconductor memory device includes a semiconductor substrate and source and drain regions formed in the semiconductor substrate and spaced from each other. First and second data lines are formed to run across over a channel region between the source and drain regions and to be disposed adjacent to the source and drain regions respectively. A first MTJ barrier layer pattern is disposed between the first data line and the channel region. A second MTJ barrier layer pattern is disposed between the second data line and the channel region. A first floated storage node is disposed between the first MTJ barrier layer pattern and the channel region. A second floated storage node is disposed between the second MTJ barrier layer pattern and the channel region. The unit cell of the semiconductor memory device further includes a word line disposed to run across over the first and second data lines, and disposed to cover both sidewalls of the first and second MTJ barrier layer patterns and both sidewalls of the first and second storage nodes.

10 Claims, 10 Drawing Sheets

SEMICONDUCTOR MEMORY DEVICES AND METHODS OF FABRICATING THE SAME

CROSS-REFERENCE TO RELATED APPLICATION

This application claims priority from Korean Patent Application No. 2004-76665, filed Sep. 23, 2004, the contents of which are hereby incorporated herein by reference in their entirety as if set forth fully herein.

BACKGROUND OF INVENTION

1. Technical Field

The present invention relates to semiconductor memory devices and methods of fabricating the same, and more particularly, to semiconductor memory devices having a plurality of vertical cell transistors sharing one planar cell transistor, and methods of fabricating the same.

2. Discussion of the Related Art

While a DRAM device has an advantage of accomplishing high integration more easily in comparison with other memory devices such as an SRAM device, it has difficulty maintaining stored charges, which are reduced with demand of a size reduction of the device, due to soft errors generated by leakage currents of memory cells, inner noise, and alpha particles from the exterior. Therefore, the memory cells of such devices require a refresh operation periodically in order to maintain the data stored in the memory cells. Further, power consumption is increased even in a standby state.

Also, flash memory devices or EEPROM devices have an advantage of not requiring an operation of refreshing memory cells in order to maintain the data stored in the memory cells. However, the flash memory device has a drawback in improving a relatively low access speed since it takes a relatively long time to program its memory cells. Further, a high voltage is required to program (write) or erase the memory cells of the flash memory device. A high electric field applied during erase and program operations degrades quality of a tunnel barrier layer which is formed of an oxide layer. The phenomenon becomes more serious when the number of times of performing erase and program operations increases. If the number of times of the erase and program operations is increased up to about $10^5$, the function of the tunnel barrier layer, which is formed of an oxide layer, is degraded. As a result, the memory device has a limited life time.

Therefore, it is required to provide a new memory cell having the advantages of the DRAM and flash memory devices. That is, it is required to provide a semiconductor memory device having scalable memory cells with long-term data maintenance (nonvolatile), a low operation voltage, a high speed, a high reliability, and a high integration. A new memory cell referred to as a scalable two transistor memory cell (STTM cell) has been proposed by Nakazato, et. al. (U.S. Pat. No. 5,952,692). According to Nakazato, et. al., the new memory cell is referred to as a planar localized electron device memory (PLEDM) cell. As the memory cell has an electrically isolated memory node (floated memory node), it is excellent in resistance to soft errors and has a high signal-to-noise ratio (S/N ratio), thereby providing a high gain. Further, the memory cell operates at room temperature without degradation by hot carriers, and can be fabricated using an existing silicon formation process. FIG. 1A is a sectional view of a conventional scalable two-transistor memory (STTM) cell, FIG. 1B is a schematic circuit diagram illustrating a conventional STTM cell, and FIG. 1C is a sectional view illustrating a conventional program transistor.

As shown in FIGS. 1A to 1C, the STTM cell includes a sensing (lower) transistor 1 known as a read or access transistor, and a program (upper) transistor 2 known as a write transistor. The program transistor 2 is a MOS transistor having a multiple tunnel junction barrier layer 4 (hereinafter, referred to as MTJ barrier layer) between source and drain regions, and a vertical two sidewalls gate. The sensing transistor 1 includes a drain region 7 and a source region 8 formed in a semiconductor substrate 18. The sensing transistor 1 is a typical MOS transistor including a floating gate 6 functioning as a storage node of a memory cell, a drain region 7 functioning as a sensing line corresponding to a bit line, and a source region 8 receiving an applied ground voltage or a specific voltage.

As shown in the same drawings, a channel region is formed between the drain region 7 and the source region 8 of the sensing transistor 1, and a first gate insulating layer 3 is formed on the channel region.

Further, as shown in the same drawings, the program transistor 2 is stacked on a gate of the sensing transistor in the STTM cell. The storage node functioning as the floating gate 6 of the sensing transistor also functions as a drain of the program transistor. A control gate line 11 formed on the sidewalls of the MTJ barrier layer 4 and the floating gate 6 functions as a write line or a word line. The source region of the program transistor functions as a data line 12. A second gate insulating layer 5 is interposed between the control gate line 11 and the data line 12. The MTJ barrier layer is formed by alternately stacking an insulating layer 13 and a semiconductor layer 14.

A data voltage is applied to the data line 12 in a write mode, and a write voltage, that is, a program voltage, is applied to the control gate (or write) line 11. Thus, since a barrier height between the data line 12 and the floating gate 6 is reduced, a tunneling current flows through insulating layers constituting the MTJ barrier layer. As a result, charges (electrons or holes) are stored in the floating gate 6. The stored charges change a threshold voltage of the sensing transistor 1. For example, in the case that electrons are stored in the floating gate 6, and the sensing transistor 1 is an NMOS transistor, a threshold voltage of the sensing transistor is increased toward a positive voltage. The write operation of the STTM cell can be conducted using a write voltage lower than that of a flash memory device. This is because the charge injection into the floating gate 6 is controlled by the control gate line 11 together with the data line 12.

In order to read the data stored in the STTM cell, a read voltage is applied to the control gate line 11, and an appropriate voltage is applied to the source region 8. Then, the current flowing through the drain region 7 is detected by a sensing amplifier (not shown). In this case, if the threshold voltage of the sensing transistor 1 is higher than the read voltage, a current does not flow through the source region 7. However, if the threshold voltage of the sensing transistor 1 is lower than the read voltage, a current flows through the source region 7.

In the STTM cell as described above, the floating gate 6 is completely surrounded by an insulating material layer unlike the storage node of the DRAM cell. That is, the floating gate 6 is floated. Thus, in the case that the read voltage is much lower than the write voltage, the memory cell need not be refreshed. On the other hand, the control gate line may be classified as a first control gate line controlling the sensing transistor, and a second control gate line controlling the program transistor. In this case, even though the write voltage is almost equal to the read voltage, the program transistor is not turned on during the read operation. Thus, it is not required to refresh the memory cell regardless of the difference between the write voltage and the read voltage.

The STTM cell must be reduced in size with the increase of an integration degree of a semiconductor IC before being formed on a semiconductor substrate. In the STTM cell formed on the semiconductor substrate, a minimum feature size (or minimum design rule) means a minimum size being formable by a photolithography technology. Since a photolithography process must be performed in order to form the STTM cell, there is a limitation to reducing the minimum feature size.

Further, since the channel length of the sensing transistor in the STTM cell is short, it is difficult to achieve a thin junction depth of the source/drain regions. Specifically, in the case that the channel is ultra short, there occur phenomena such as a short channel effect and a drain induced barrier lowering, thereby degrading operation characteristics of the STTM cell.

Furthermore, in the STTM cell, the area ratio between a memory cell and interconnection lines is large.

SUMMARY OF THE INVENTION

Therefore, the present invention is directed to semiconductor memory device, its unit cell being scalable with its minimum feature size reduced, and a method of fabricating the same.

The present invention is also directed to a semiconductor memory device being suitable to suppressing a short channel effect, and a method of fabricating the same.

The present invention provides a highly-integrated semiconductor memory device being suitable for storing two bits of data in one unit cell and a method of fabricating the semiconductor memory device.

In a first aspect, the invention provides a semiconductor memory device having a plurality of unit cells. The unit cell of the semiconductor memory device includes a semiconductor substrate and source and drain regions in the semiconductor substrate and spaced from each other. First and second data lines are disposed to run across over a channel region between the source and drain regions, and are disposed adjacent to the source and drain regions, respectively. A first multiple tunnel junction (MTJ) barrier layer pattern is disposed between the first data line and the channel region. A second MTJ barrier layer pattern is disposed between the second data line and the channel region. A first floated storage node is disposed between the first MTJ barrier layer pattern and the channel region. A second floated storage node is disposed between the second MTJ barrier layer pattern and the channel region. The unit cell of the semiconductor memory device further includes word line disposed to run across over the first and second data lines, and disposed to cover both sidewalls of the first and second MTJ barrier layer patterns along with both sidewalls of the first and second storage nodes.

In accordance with an exemplary embodiment of the present invention, each of the first and second MTJ barrier layer patterns may be alternately stacked semiconductor and insulating layers. The MTJ barrier layer may be a semiconductor layer with a band gap energy lower than 3.5 eV, and an insulating layer with a band gap energy lower than 10 eV stacked alternately to a maximum ten times. The semiconductor layer of the MTJ barrier layer may be at least one of a silicon layer, a germanium layer, a silicon germanium layer, and a silicon germanium carbide layer. The insulating layer of the MTJ barrier layer may be at least one of a silicon oxide layer, a silicon nitride layer, a silicon oxynitride layer, a metal oxide layer, a metal nitride layer, and a metal silicate layer.

Further, each of the first and second data lines may include a lower conductive layer and an upper conductive layer having a resistivity lower than that of the lower conductive layer.

Further, a gate insulating layer may be interposed between the word line and each sidewall of the first and second data lines, the first and second MTJ barrier layer patterns and the first and second floated storage nodes.

Further, the word line together with the first and second floated storage nodes, the first and second MTJ barrier layer patterns, and the first and second data lines may operate as one pair of vertical program transistors.

Further, the source/drain regions in the semiconductor substrate and the first and second floated storage nodes disposed on the channel region between the source/drain regions may operate as one planar sensing transistor.

Further, the one pair of program transistors may be disposed on the sensing transistor.

Further, the first and second floated storage nodes may function as a gate electrode of the sensing transistor and concurrently function as a drain region of the program transistors.

Further, the data lines or the word line may be a silicon layer doped with a high density, a metal layer, a metal silicide layer, a polycide layer, or a mixture layer including the above layers.

Further, the floated storage node may include at least one of a silicon layer, a germanium layer, a silicon germanium layer, and a silicon germanium carbide layer.

Further, the source and drain regions may be lightly doped drain (LDD) structures.

In another aspect of the present invention, the present invention provides a method of fabricating a semiconductor memory device. The method includes forming a plurality of first insulating layer patterns on a semiconductor substrate, each pattern having an island shape, and forming a first conductive layer pattern and an MTJ barrier layer pattern, which are disposed to fill regions between the first insulating layer patterns and are sequentially stacked with a mesh shape. A plurality of parallel data line patterns are formed to cover the first insulating layer patterns and the MTJ barrier layer pattern between the first insulating layer patterns, and each of the data line patterns has a preliminary data line and a capping layer pattern, which are sequentially stacked. The MTJ barrier layer pattern and the first conductive layer pattern are etched using the data line patterns as etch masks, thereby forming MTJ barrier layer patterns and first conductive layer patterns separated by the first insulating layer patterns below the data line patterns and forming line-shaped openings between the data line patterns, thereby exposing an upper surface of the substrate through the openings. First spacers are formed on sidewalls of each of the openings. Impurity ions are implanted into the semiconductor substrate using the data line patterns and the first spacers as ion implantation masks, thereby forming source/drain regions. The capping layer patterns are removed, thereby exposing upper surfaces of the preliminary data lines and inner sidewalls of the first spacers. Second spacers are formed on inner sidewalls of the first spacers. The preliminary data lines, the MTJ barrier layer patterns, and the first conductive layer patterns are etched, using the first and second spacers as etch masks, thereby forming first and second separated vertical structures on the channel regions respectively between the source/drain regions. Each of the first and second separated vertical structures has a storage node, an MTJ barrier layer pattern and a data line, which are sequentially stacked. The first and second spacers are removed. Word lines are formed to cover at least both sidewalls of the first and second vertical structures, and to run across over the data lines.

In accordance with an exemplary embodiment of the present invention, the formation of the first conductive layer pattern, the MTJ barrier layer pattern, and the first insulating layer patterns includes sequentially forming a gate insulating layer, a first conductive layer, an MTJ barrier layer, and a CMP stop layer on the semiconductor substrate; patterning at least the CMP stop layer, the MTJ barrier layer, and the first conductive layer, thereby forming a plurality of island-shaped field regions; forming a first insulating layer on the CMP stop layer to fill the field regions; planarizing the first insulating layer, thereby exposing the CMP stop layer; and removing the exposed CMP stop layer.

Further, after the first and second spacers are removed, a second gate insulating layer may be formed to cover at least both sidewalls of the first and second vertical structures.

Further, third spacers may be formed on the outer sidewalls of the first spacers while the second spacers are formed on the inner sidewalls of the first spacers.

In accordance with an exemplary embodiment of the present invention, the method may further include implanting low density impurity ions into the semiconductor substrate before forming the source/drain regions by implanting impurity ions into the semiconductor substrate, using the data line patterns and the first spacers as ion implantation masks.

Further, the data lines or the word line may be formed of a silicon layer doped with a high density, a metal layer, a metal silicide layer, a polycide layer, or a mixture layer including the above layers.

Further, the floated storage node may include at least one selected from the group consisting of a silicon layer, a germanium layer, a silicon germanium layer, and a silicon germanium carbide layer.

In one embodiment, the formation of the MTJ barrier layer comprises alternately stacking a semiconductor layer and an insulating layer, and the semiconductor layer is formed of at least one selected from the group consisting of a silicon layer, a germanium layer, a silicon germanium layer, and a silicon germanium carbide layer. In one embodiment, the insulating layer is formed of at least one selected from the group consisting of a silicon oxide layer, a silicon nitride layer, a silicon oxynitride layer, a metal oxide layer, a metal nitride layer, and a metal silicate layer.

In one embodiment, the data lines or the word line are formed of a silicon layer doped with a high density, a metal layer, a metal silicide layer, a polycide layer, or a mixture layer including the above layers.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully hereinafter with reference to the accompanying drawings, in which preferred embodiments of the invention are shown. When a layer is described as being formed on another layer or on a substrate, the layer may be formed on the other layer or on the substrate, or a third layer may be interposed between the layer and the other layer or the substrate. Further, the terms used in the description of this specification, which are widely used in documents and well known to those skilled in the art, will be defined in order to clarify the meaning as follows:

word line: write line or control gate line;

bit line: read line or sensing line;

sensing transistor: read transistor, access transistor or lower transistor; and program transistor: write transistor or upper transistor.

Specifically, the reference of an "x-axis" and a "y-axis" in this description of the present invention is not intended to indicate any specific concrete locations, but just to define directions of relative positions between component elements of the present invention.

Figure 1A:
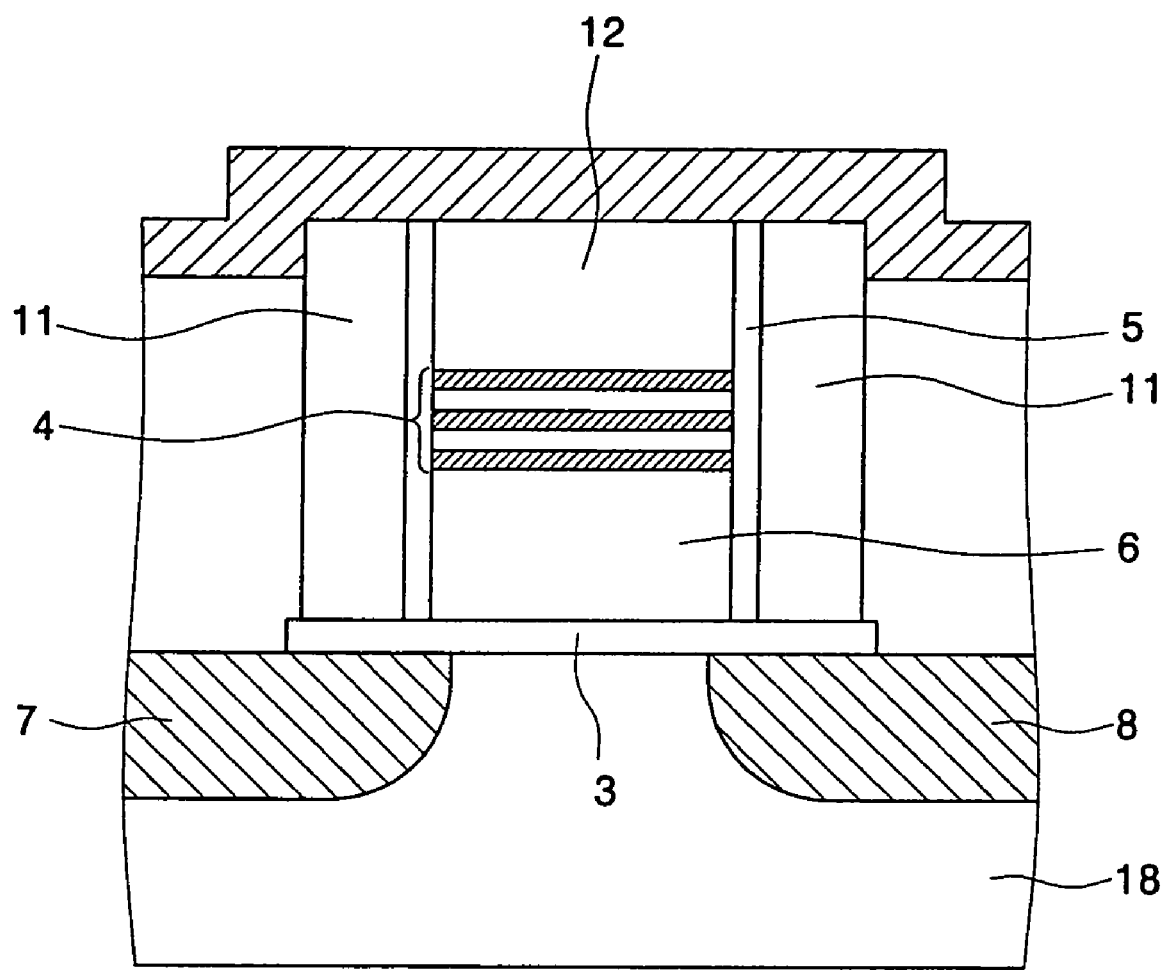
FIG. 1A is a sectional view of a conventional scalable two-transistor memory (STTM) cell.
Figure 1B:
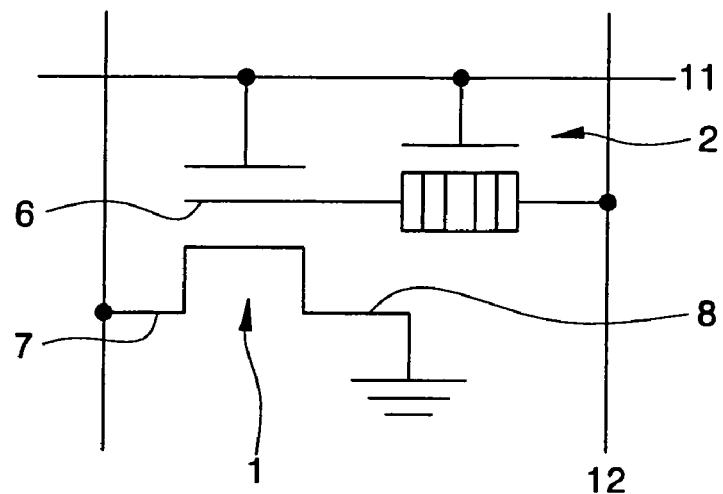
FIG. 1B is a schematic circuit diagram illustrating a conventional STTM cell.
Figure 1C:
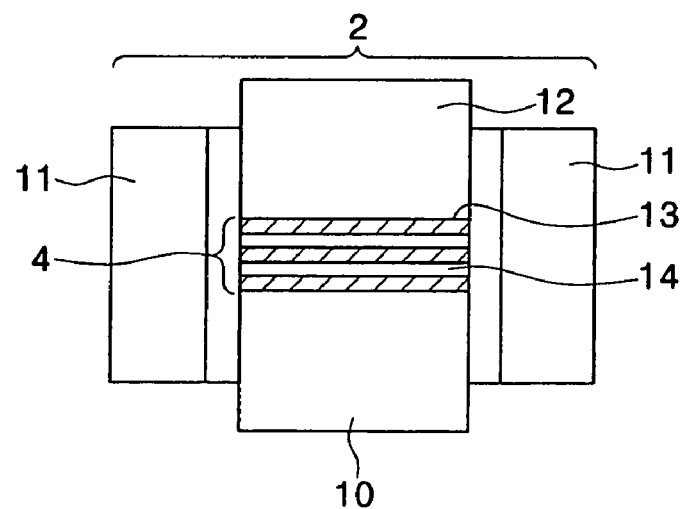
FIG. 1C is a sectional view illustrating a conventional program transistor.
Figure 2:
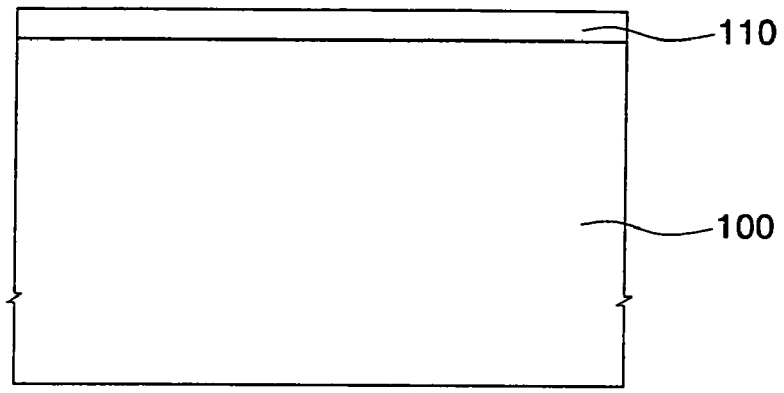
FIGS. 2 and 3 are sectional views illustrating a semiconductor memory device and a method of fabricating the same according to an embodiment of the present invention.
Figure 3:
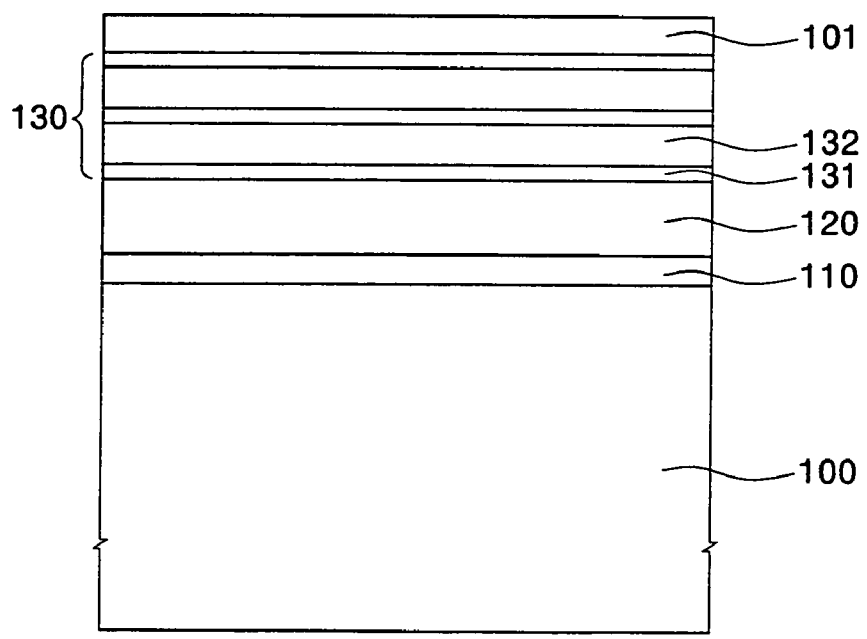
Figure 4A:
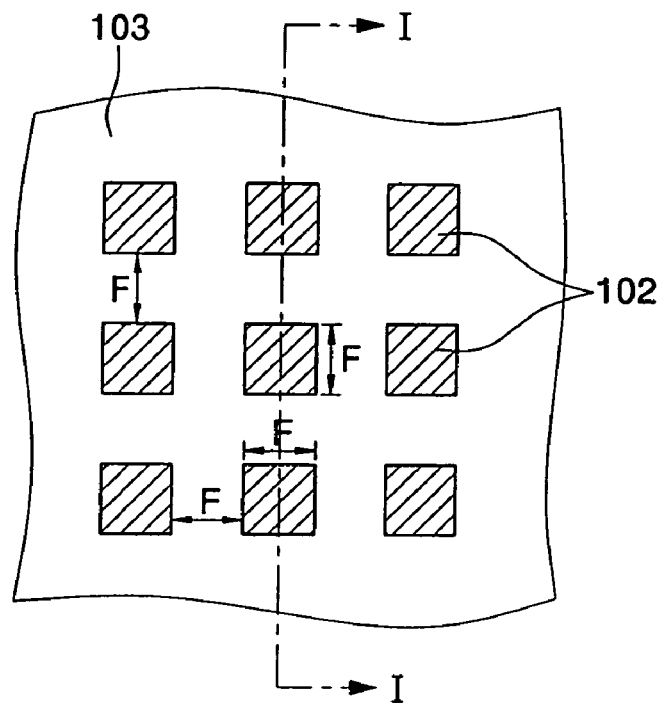
FIG. 4A is a schematic plan view illustrating the layout of an active region and field isolation regions according to an embodiment of the present invention.
Figure 4B:
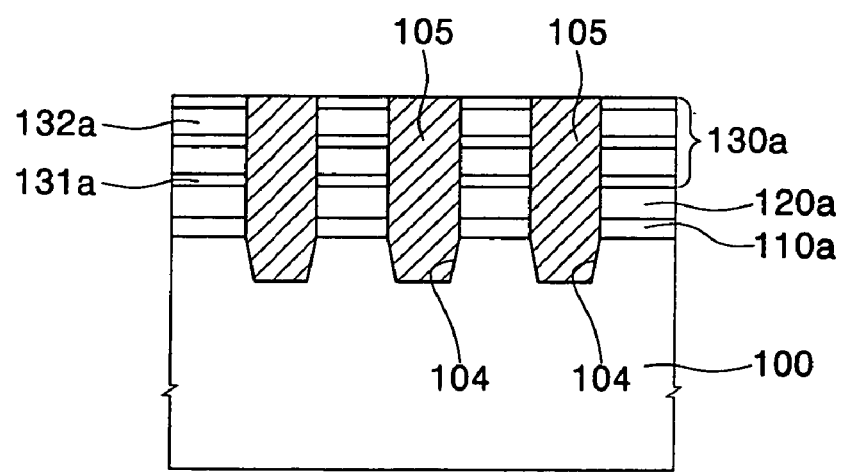
FIG. 4B is a sectional view taken along a line of I-I of FIG. 4A.
Figure 5A:
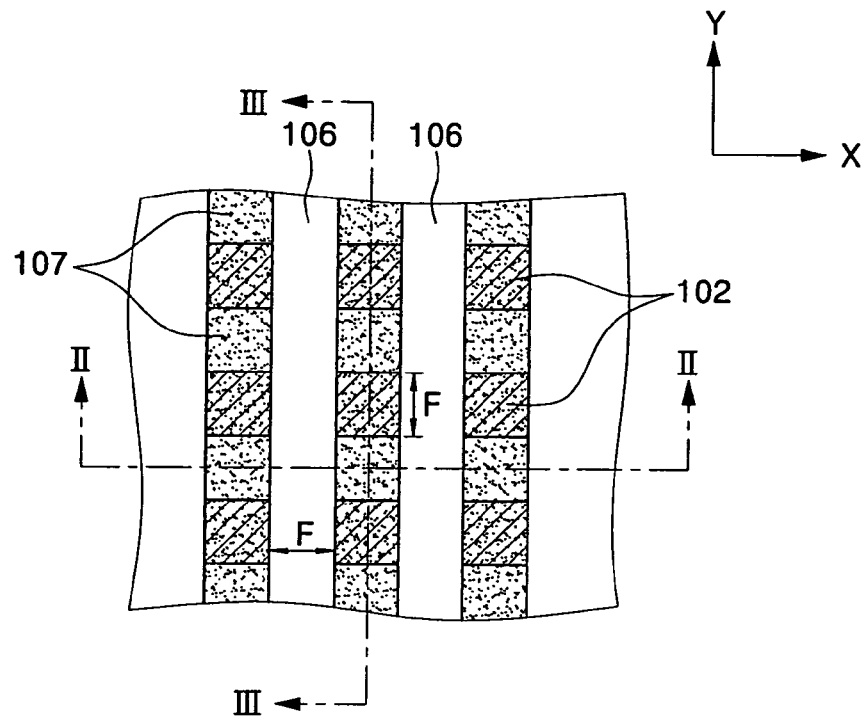
FIG. 5A is a schematic plan view illustrating the layout of data lines according to an embodiment of the present invention.
Figure 5B:
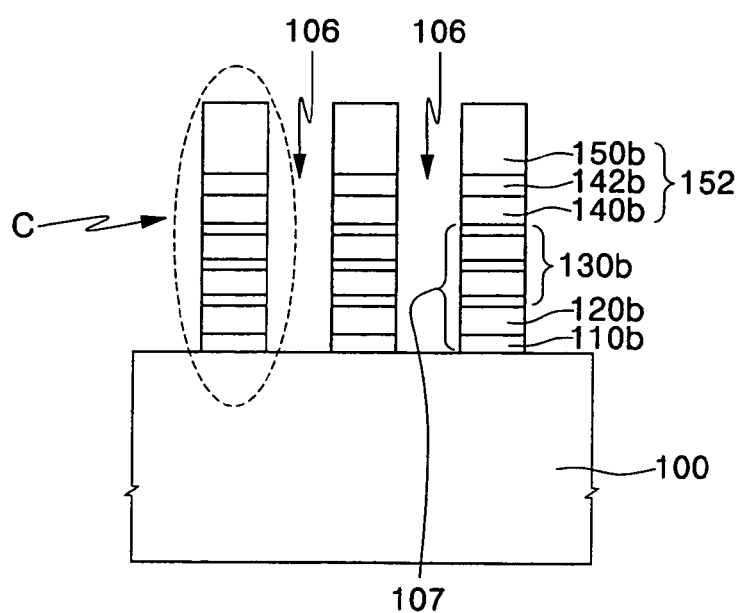
FIG. 5B is a sectional view taken along a line of II-II of FIG. 5A.
Figure 5C:
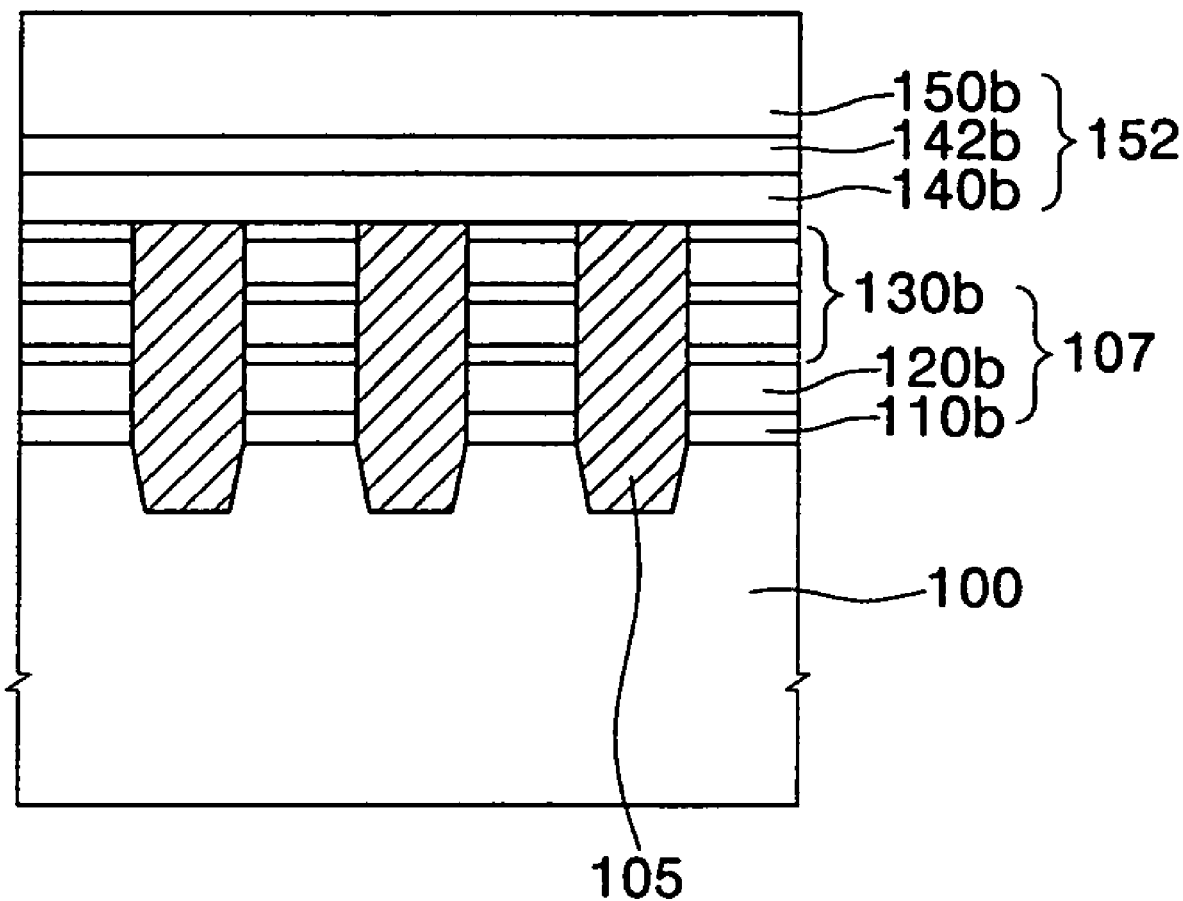
FIG. 5C is a sectional view taken along a line of III-III of FIG. 5A.

FIGS. 2 and 3 are sectional views illustrating semiconductor memory devices and methods of fabricating the same according to an embodiment of the present invention. FIG. 4A is a schematic plan view illustrating the layout of an active region and field isolation regions according to an embodiment of the present invention. FIG. 4B is a sectional view taken along a line of I-I of FIG. 4A. FIG. 5A is a schematic plan view illustrating the layout of data lines according to an embodiment of the present invention. FIG. 5B is a sectional view taken along a line of II-II of FIG. 5A. FIG. 5C is a sectional view taken along a line of III-III of FIG. 5A. FIGS. 6 to 12 are sectional views illustrating a semiconductor memory device and a method of fabricating the same according to an embodiment of the present invention from the partial enlarged view of FIG. 5B. FIG. 13 is a plan view of a semiconductor memory device according to an embodiment of the present invention.

Referring to FIG. 2, impurity ions are implanted into a semiconductor substrate 100, thereby forming a conductive well. The substrate 100 may be composed of a material selected from the group consisting of silicon (Si), silicon germanium (SiGe), silicon germanium on silicon, silicon germanium carbide (SiGeC) on silicon, and silicon on insulator (SOI). A p-type well or an n-type well may be formed in the semiconductor substrate 100, but for the convenience of description, a p-type well is formed in the substrate 100.

A gate insulating layer 110 is formed on the overall surface of the semiconductor substrate 100 formed as above. The gate insulating layer 110 may be formed of a gate oxide layer. The gate oxide layer may be formed by thermally oxidizing the substrate 100.

Referring to FIG. 3, a first conductive layer 120, an MTJ barrier layer 130, and a chemical mechanical polishing (CMP) stop layer 101 are sequentially formed on the gate insulating layer 110. The first conductive layer 120 may be formed of a doped poly-crystalline semiconductor layer or a doped amorphous semiconductor layer. The doped poly-crystalline semiconductor layer or doped amorphous semiconductor layer may be a silicon layer, a germanium layer, a silicon germanium layer, or a silicon germanium carbide layer. The crystalline phase (poly-crystalline or amorphous structure) of the first conductive layer 120 is determined by its deposition temperature or the deposition temperature of the layers formed during subsequent processes.

The MTJ barrier layer 130 may be formed by stacking a semiconductor layer 132 with a thickness of 1000 Å or less and a band gap energy lower than 2 eV, and an insulating layer 131 with a thickness of 100 Å or less and a band gap energy lower than 10 eV alternately one through ten times. A material used for the semiconductor layer 132 to form the MTJ barrier layer 130 is one selected from the group consisting of undoped silicon, doped silicon, germanium, silicon germanium, and silicon germanium carbide. The semiconductor layer 132 for the MTJ barrier layer 130 is formed on the floating gate layer within a temperature range at which the crystalline phase of the semiconductor layer 132 right after deposition is amorphous or polycrystalline structure. The temperature range employed to form the semiconductor layer 132 is normally 300° C. to 900° C. A material used for the insulating layer 131 for the MTJ barrier layer 130 may be one selected from the group consisting of silicon oxide, silicon nitride, silicon oxynitride, metal oxide, and metal nitride. The metal oxide may be hafnium oxide ($HfO_x$), zirconium oxide ($ZrO_x$) or aluminum oxide ($Al_2O_3$). The metal nitride may be aluminum nitride (AlN). In the case that the first conductive layer 120 is formed of an $n^+$-type semiconductor layer, the semiconductor layer 132 to form the MTJ barrier layer 130 may be formed of a p-type semiconductor layer.

The CMP stop layer 101 may be formed of a silicon nitride (SiN) layer.

Referring to FIGS. 4A and 4B, the CMP stop layer 101, the MTJ barrier layer 130, the first conductive layer 120, and the gate insulating layer 110 are sequentially patterned, thereby forming a mesh-shaped MTJ barrier layer pattern 130a. As a result, a plurality of island-shaped field regions 102 are defined inside the MTJ barrier layer pattern 130a, and a mesh-shaped active region 103 is defined below the MTJ barrier layer pattern 130a as shown in FIG. 4A.

Further, a gate insulating layer pattern 110a and a first conductive layer pattern 120a, which are sequentially stacked, are formed below the MTJ barrier layer pattern 130a. Each of the field regions 102 can be patterned as a square shape having a width and a length in accordance with a resolution limit of a photolithography process, that is, a minimum design rule F.

Then, the substrate 100 may be additionally etched using the patterned CMP stop layer 101 as an etch mask. As a result, a plurality of island-shaped trench regions 104 may be formed in the substrate 100. A first insulating layer 105 is formed on the patterned CMP stop layer 101 to fill the field regions 102 or the trench regions 104, and the first insulating layer 105 is planarized using a chemical mechanical polishing process, thereby exposing the patterned CMP stop layer 101. Then, the patterned CMP stop layer 101 is selectively removed.

Referring to FIGS. 5A and 5B, a second conductive layer and a second insulating layer are sequentially formed on the substrate from which the CMP stop layer 101 is removed. The second insulating layer functions as a capping layer. The second conductive layer may be formed of a doped polysilicon layer, a polyside layer, or a metal layer, and the capping layer may be formed of a silicon nitride layer. In the case that the semiconductor layer 132a of the MTJ barrier layer pattern 130a is formed of a p-type semiconductor layer, the second conductive layer may be formed of an $n^+$-type semiconductor layer. Further, in the case that the second conductive layer is formed of an $n^+$-type semiconductor layer, a third conductive layer having a low resistivity such as a metal layer may be formed between the second conductive layer and the capping layer. The third conductive layer may be formed of a tungsten layer.

The capping layer, the second conductive layer, and the third conductive layer are sequentially patterned, thereby forming data line patterns 152 being in parallel with each other. As a result, each of the data line patterns 152 is formed to include a second conductive layer pattern 140b, a third conductive layer pattern 142b, and a capping layer pattern 150b, which are sequentially stacked. The second conductive layer pattern 140b and the third conductive layer pattern 142b constitute a preliminary data line. In the case of omitting the process of forming the third conductive layer, the preliminary data line is formed of only the second conductive layer pattern. As shown in FIG. 5C, each of the data line patterns 152 is formed to cover the first insulating layers 105 aligned along a y-axis of FIG. 5A and the MTJ barrier layer pattern 130a between them.

Then, the MTJ barrier layer pattern 130a, the first conductive layer pattern 120a, and the gate insulating layer pattern 110a are etched using the capping layer patterns 150b as an etch mask, thereby forming openings 106 exposing the substrate 100 between the capping layer patterns 150b. As a result, stacked structures 107, which are separated from each other, are respectively formed below the data line patterns 152. That is, the stacked structures 107, which are aligned along the y-axis, are separated by the first insulating layer 105 as shown in FIG. 5C, and the stacked structures 107, which are aligned along an x-axis of FIG. 5A, are separated by the openings 106 as shown in FIG. 5B. Each of the stacked structures 107 includes a gate insulating layer pattern 110b, a first conductive layer pattern 120b, and an MTJ pattern 130b, which are sequentially stacked.

Figure 6:
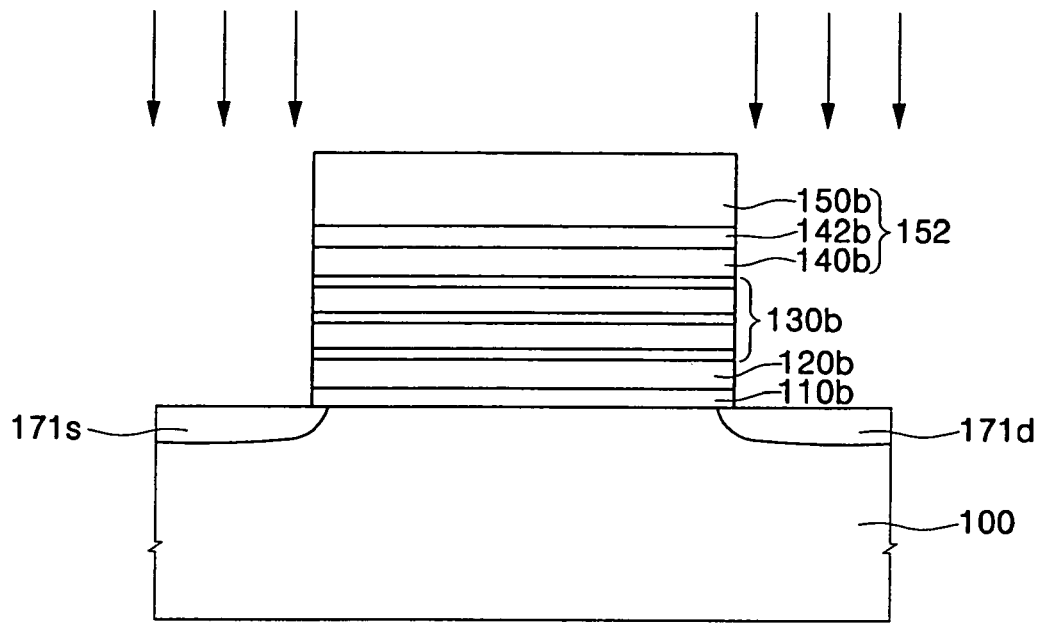
FIGS. 6 to 12 are sectional views illustrating a semiconductor memory device and a method of fabricating the same according to an embodiment of the present invention from the partial enlarged view of FIG. 5B.

FIG. 6 is a partial enlarged view of FIG. 5B. Specifically, for clarity of description, the following description will be made based on one unit cell (indicated by a reference letter "C" of FIG. 5B) of a semiconductor memory device in accordance with the invention. The drawings referred to in the following description (FIGS. 7 through 12) are presented based on FIG. 6.

Referring to FIG. 6, an ion implantation process is performed using the capping layer pattern 150b as an ion implantation mask, thereby forming first and second impurity regions 171s, 171d in the semiconductor substrate 100. The first and second impurity regions 171s, 171d are formed to be separated from each other with a channel region disposed between them. When ions are implanted as above, low density impurity ions can be implanted into the semiconductor substrate 100 to form a lightly doped drain (LDD). For example, low density n-type impurity ions can be implanted into the semiconductor substrate 100 having a p-type well.

Figure 7:
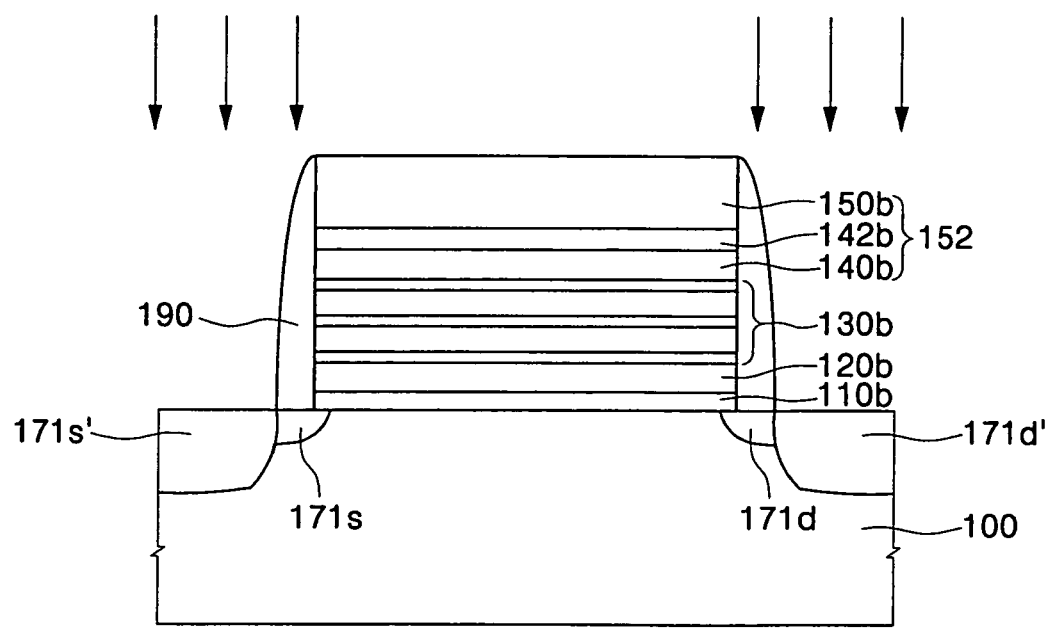

Referring to FIG. 7, a third insulating layer such as a silicon nitride layer is formed on the semiconductor substrate 100 having the impurity regions 171s, 171d, and etched back, thereby forming first spacers 190. Thus, the first spacers 190 are formed to cover both sidewalls of the gate insulating layer pattern 110b, the first conductive layer pattern 120b, the MTJ barrier layer pattern 130b, the second conductive layer pattern 140b, the third conductive layer pattern 142b, and the capping layer pattern 150b. Concurrently, the first spacers 190 partially cover the substrate 100, and partially expose the first and second impurity regions 171s, 171d. Using the first spacers 190 and the capping layer pattern 150b as ion implantation masks, n-type impurity ions are implanted into the semiconductor substrate 100, thereby forming a source region 171s' and a drain region 171d'. The source/drain regions 171s', 171d' may be formed to have an impurity density higher than that of the first and second impurity regions 171s, 171d.

Figure 8:
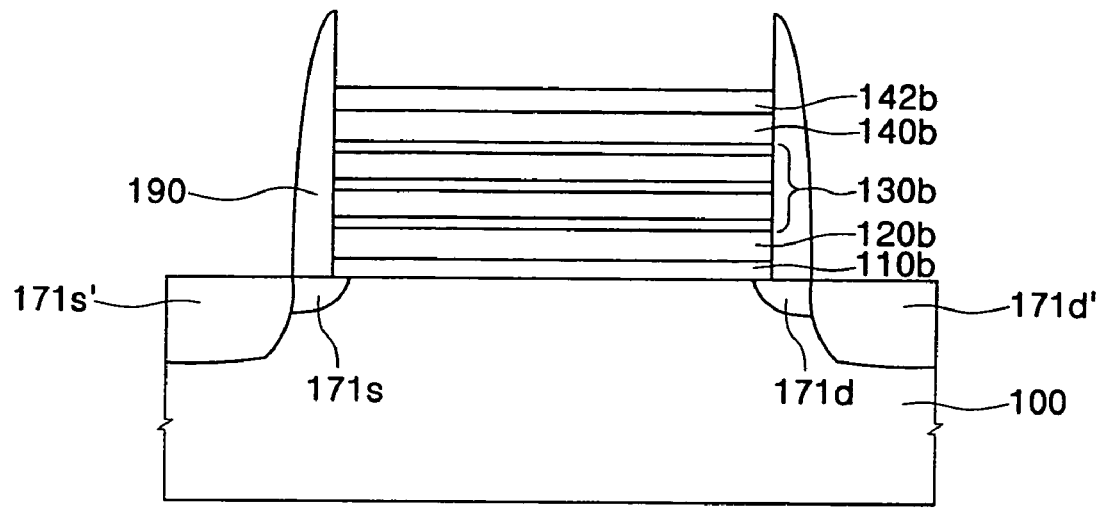

Referring to FIG. 8, the capping layer pattern 150b is removed. A wet etch process may be used in order to remove the capping layer pattern 150b. The capping layer pattern 150b and the first spacers 190 may be formed of insulating layers having different etch etch selectivities.

Figure 9:
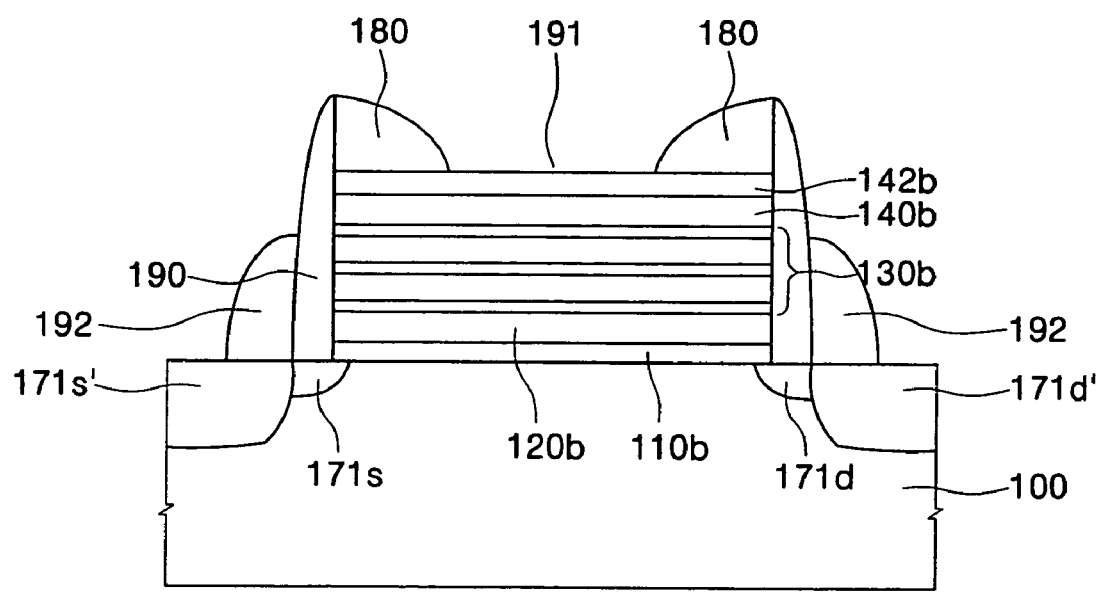

Referring to FIG. 9, a fourth insulating layer such as a silicon nitride layer is conformally formed on the substrate from which the capping layer patterns 150b are removed. The fourth insulating layer is etched back, thereby forming a second opening 191 with line shape exposing an upper surface of the second upper conductive layer pattern 142b. As a result, second spacers 180 covering the inner sidewalls of the first spacers 190 and the edge portions of the second upper conductive layer pattern 142b, and third spacers 192 covering the outer sidewalls of the first spacers 190 are formed.

Figure 10:
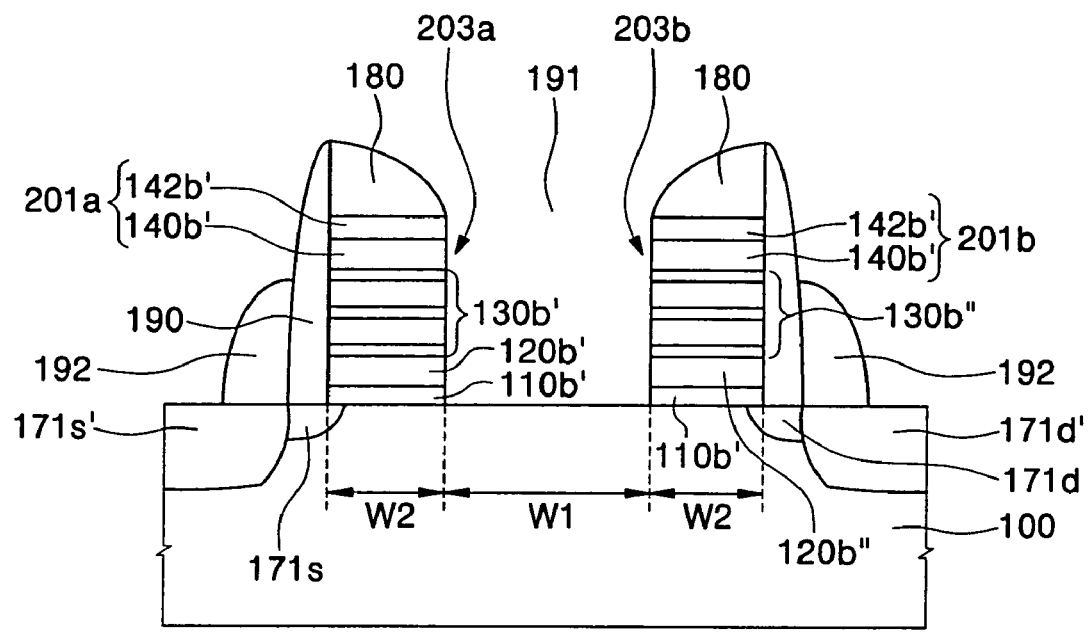

Referring to FIG. 10, the third conductive layer pattern 142b, the second conductive layer pattern 140b, the MTJ barrier layer pattern 130b, the first conductive layer pattern 120b, and the gate insulating layer pattern 110b are sequentially etched, using the first to third spacers 190, 180, 192 as etch masks, thereby forming vertical structures 203a, 203b below the second spacers 180. As a result, a pair of separated vertical structures 203a, 203b are formed on the channel region between the source region 171s' and the drain region 171d'. The first vertical structure 203a is formed to include the first floated storage node 120b', the first MTJ barrier layer pattern 130b', and the first data line 201a, which are sequentially stacked, and the second vertical structure 203b is formed to include the second floated storage node 120b", the second MTJ barrier layer pattern 130b", and the second data line 201b, which are sequentially stacked. An upper surface of the substrate 100 is exposed between the first vertical structure 203a and the second vertical structure 203b. The storage nodes 120b', 120b" are electrically insulated from the channel region by the first gate insulating layer pattern 110b', and each of the first and data lines 201a, 201b may include the second conductive layer pattern 140b' and the third conductive layer pattern 142b', which are sequentially stacked.

The width of the second spacer 180 and the distance between the second spacers 180 depend on the thickness of the fourth insulating layer to form the second spacers 180 regardless of a photolithography technology. Thus, when the thickness of the fourth insulating layer is appropriately controlled, the widths W2 of the vertical structures 203a, 203b and the distance W1 between them can be controlled to be smaller than a resolution limit of the photolithography technology, that is, a minimum feature size F.

In another embodiment of the present invention, if the source/drain regions 171s', 171d' are partially exposed after the second and third spacers 180, 192 are formed, an additional etch mask (not shown) such as a photoresist pattern covering the source/drain regions 171s', 171d' can be formed before an etch process of forming the vertical structures 203a, 203b is performed. In this case, the exposed source/drain regions 171s', 171d' during the etch process of forming the vertical structures 203a, 203b can be protected by the additional etch mask.

Figure 11:
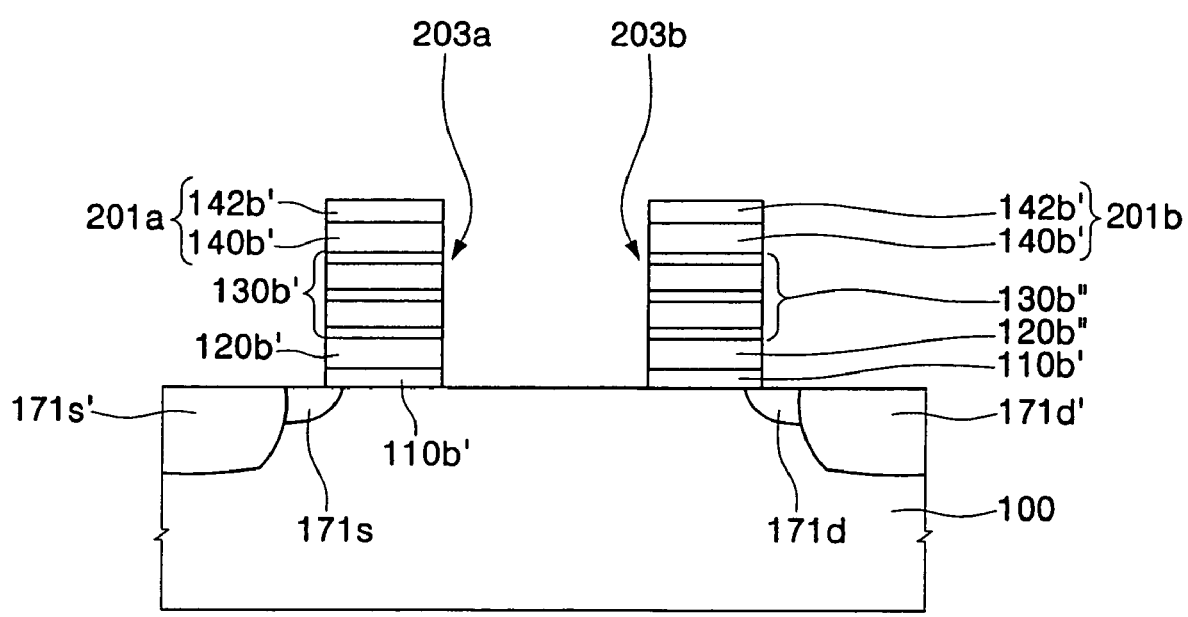

Referring to FIG. 11, the first to third spacers 190, 180, 192 are removed. The spacers 190, 180, 192 can be removed using a wet etch process.

Figure 12:
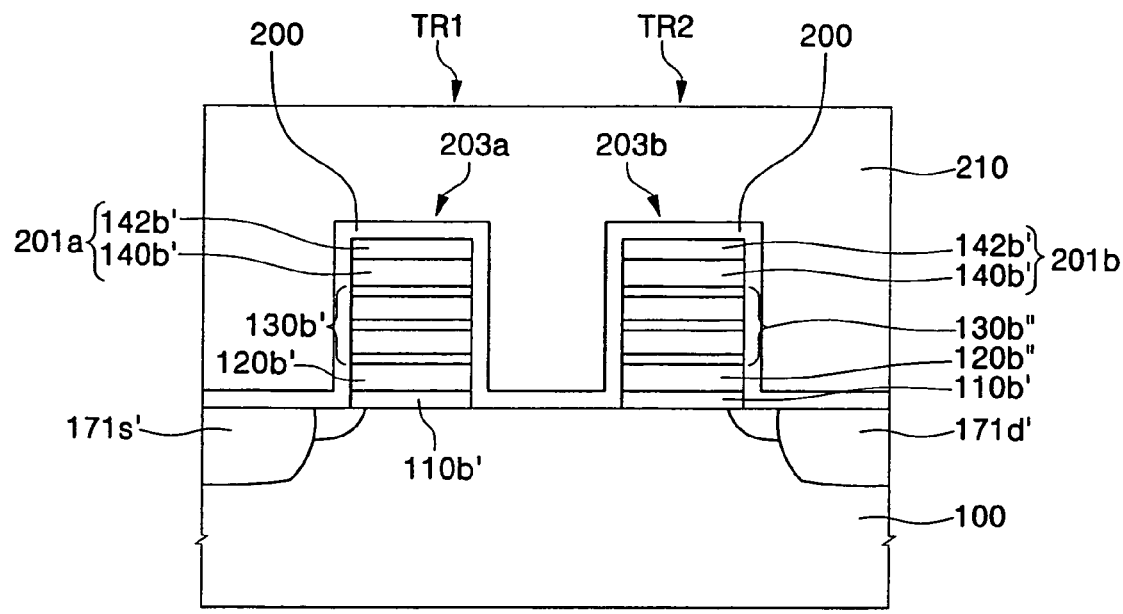
Figure 13:
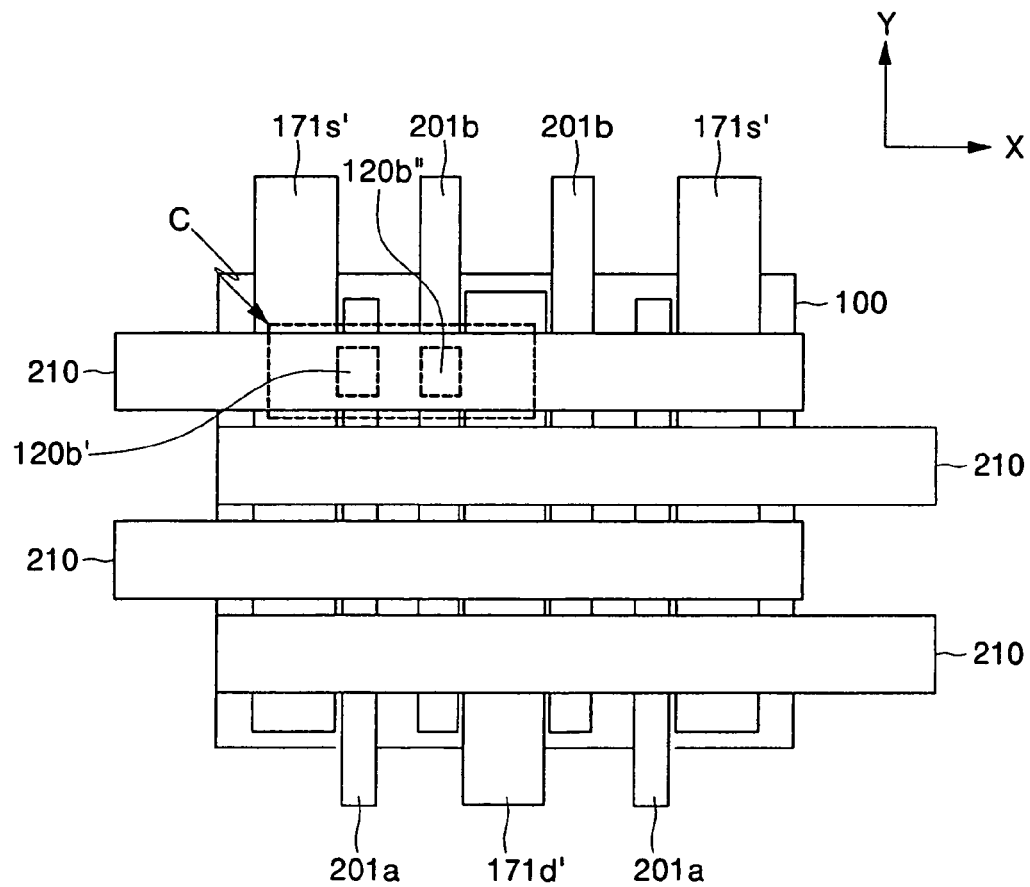
FIG. 13 is a plan view of a semiconductor memory device according to an embodiment of the present invention.

Referring to FIG. 12, a second gate insulating layer 200 is conformally formed to cover both sidewalls and upper portions of the vertical structures 203a, 203b. The second gate insulating layer 200 is formed to extend and cover the exposed upper portions of the substrate 100. The second gate insulating layer 200 may be formed of a silicon oxide layer. The second gate insulating layer 200 may be formed of a thermal oxide layer. Thus, the second gate insulating layer 200 is formed on the substrate 100 exposed through the second opening 191.

Then, referring to the same drawing, a fourth conductive layer is stacked on the overall surface of the resultant structure formed by the process. The fourth conductive layer is patterned, thereby forming a word line 210 running across over the data lines 201a, 201b. The fourth conductive layer may be formed of a silicon layer doped with a high density, a metal layer, a metal silicide layer, a polycide layer, or a mixture layer including the above layers. Thus, the word line 210 runs across over the data lines 201a, 201b, and covers the both sidewalls of the MTJ barrier layer patterns 130b', 130b" and the storage nodes 120b', 120b". The word line 210 functions as a control gate.

As a result, separated first and second vertical program transistors TR1, TR2 are formed on the channel region between the source/drain regions 171s', 171d'. That is, the first program transistor TR1 includes the first storage node 120b', the first MTJ barrier layer pattern 130b', and the first data line 201a, which are sequentially stacked, and the word line 210. The second program transistor TR2 includes the second storage node 120b", the second MTJ barrier layer pattern 130b", and the second data line 201b, which are sequentially stacked, and the word line 210. Here, the storage nodes 120b', 120b" and the data lines 201a, 201b function as source/drain regions of the program transistors TR1, TR2, and the word line 210 functions as a common gate electrode of the program transistors TR1, TR2.

Further, the source/drain regions 171s', 171d' formed in the semiconductor substrate 100, and the one pair of storage nodes 120b', 120b" formed on the channel region between them constitute one single planar sensing transistor. The one pair of storage nodes 120b', 120b" substantially function as gate electrodes of the planar sensing transistor. As a result, the unit cell of the semiconductor memory device fabricated according to the present invention includes the one pair of the vertical program transistors TR1, TR2 and the one single sensing transistor, and the one single sensing transistor includes one pair of separated gate electrodes (the storage nodes 120b', 120b").

Now, a semiconductor memory device according to the embodiments of the present invention will be described with reference to FIGS. 12 and 13. In FIG. 13, a portion indicated by a reference letter "C" means a unit cell region, and FIG. 12 is a sectional view of the unit cell region C.

Referring to FIGS. 12 and 13, a plurality of impurity regions being in parallel with each other are formed in the semiconductor substrate 100. The impurity regions are disposed in parallel with a y-axis, and include the source regions 171s' and the drain regions 171d', which are alternately and repeatedly aligned. The source/drain regions 171s', 171d' function as reference voltage lines such as bit lines or ground lines. First and second parallel data lines 201a, 201b are disposed on the channel region between the source region 171s' and the drain region 171d', which are disposed adjacent to each other. A plurality of parallel word lines 210 are disposed to run across over the data lines 201a, 201b. That is, the word lines 210 are disposed in parallel with an x-axis.

The first MTJ barrier layer patterns 130b' are disposed between the first data lines 201a and the channel regions, and the second MTJ barrier layer patterns 130b" are disposed between the second data lines 201b and the channel regions. Further, the first storage nodes 120b' are interposed between the first MTJ barrier layer patterns 130b' and the channel regions, and the second storage nodes 120b" are interposed between the second MTJ barrier layer patterns 130b" and the channel regions. The storage nodes 120b', 120b" are insulated from the channel region by the gate insulating layer patterns 110b'. Further, the word lines 210 are electrically insulated from the data lines 201a, 201b, the sidewalls of the MTJ barrier layer patterns 130b', 130b", and the sidewalls of the storage nodes 120b', 120b" by the second gate insulating layer 200. Further, the word lines 210 may be insulated from the channel region between the storage nodes 120b', 120b", which are disposed adjacent to each other, by the second gate insulating layer 200.

The word line 210 together with the first storage node 120b', the first MTJ barrier layer pattern 130b', and the first data line 201a constitute the first vertical program transistor TR1. The word line 210 together with the second storage node 120b", the second MTJ barrier layer pattern 130b", and the second data line 201b constitute the second vertical program transistor TR2.

As a result, one pair of program transistors TR1, TR2 sharing the word line 210 are formed in the one single unit cell region C. The word line 210 functions as a gate electrode of the program transistors TR1, TR2, and the data lines 201a, 201b and the storage nodes 120b', 120b" function as source/drain regions of the program transistors TR1, TR2. Further, the source/drain regions 171s', 171d' formed in the semiconductor substrate 100, and the one pair of storage nodes 120b', 120b" formed on the channel region between them constitute one single planar sensing transistor. The one pair of storage nodes 120b', 120b" substantially function as a gate electrode of the sensing transistor.

As described above, according to the present invention, one unit cell includes one pair of vertical program transistors and one planar sensing transistor, and the MTJ barrier layer patterns and the storage nodes of the program transistors can be patterned to have a width smaller than the resolution limit of the photolithography process. Therefore, since two bits of information can be stored in the one unit cell, the integration degree of the semiconductor memory device can be substantially increased.

Hereinafter, methods of driving the cell of the semiconductor memory device described above will be described.

A typical DRAM cell selectively operates by the voltages applied to two control lines, that is, a word line and a bit line. On the contrary, the semiconductor memory cell according to the present invention selectively operates by the voltages applied to three control lines, that is, a word line, a data line, and a bit line. The bias conditions to selectively program or read any one of the semiconductor memory cells shown in FIGS. 12 and 13 can be described as shown in Table 1. In the embodiments, the program transistors TR1; TR2 of FIG. 12 and the sensing transistor are assumed to be n-channel transistors for convenience of description only.

TABLE 1

| Operation State | word line (voltage) | data line (1) (voltage) | data line (2) (voltage) | source (voltage) | drain (voltage) | TR1 | TR2 |
|---|---|---|---|---|---|---|---|
| Program | Vp | VD2 | VD2 | — | — | 1 | 1 |
|  | Vp | VD2 | VD1 | — | — | 1 | 0 |
|  | Vp | VD1 | VD2 | — | — | 0 | 1 |
|  | Vp | VD1 | VD1 | — | — | 0 | 0 |
| Read | Vr | — | — | 0 | Vs | (selected) | — |
|  | Vr | — | — | Vs | 0 | — | (selected) |

As shown in Table 1, and FIGS. 12 and 13, the program operation for storing desired data into the first and second storage nodes 120b', 120b" constituting one unit cell can be accomplished by applying a program voltage Vp to one of the word lines 210, and applying appropriate data line voltages to the first and second data lines 201a, 201b respectively. The program voltage Vp is higher than the threshold voltage of the first and second vertical program transistors TR1, TR2.

If a first data voltage VD1 equal to the program voltage Vp, and a second data voltage VD2 lower than the program voltage Vp are applied to the first and second data lines 201a, 201b respectively, holes are injected from the first data line 201a to the first storage node 120b', and electrons are injected from the second data line 201b to the second storage node 120b". As a result, data of a low level (logic "0") is stored in the first program transistor TR1, and data of a high level (logic "1") is stored in the second program transistor TR2.

On the contrary, if the second data voltage VD2 and the first data voltage VD1 are applied to the first and second data lines 201a, 201b respectively, electrons are injected from the first data line 201a to the first storage node 120b', and holes are injected from the second data line 201b to the second storage node 120b". As a result, data of a high level (logic "1") is stored in the first program transistor TR1, and data of a low level (logic "0") is stored in the second program transistor TR2.

Further, if the first data voltage VD1 is applied to the first and second data lines 201a, 201b, holes are injected from the first and second data lines 201a, 201b to the first and second storage nodes 120b', 120b". As a result, the data of a low level (logic "0") is stored into the first and second program transistors TR1, TR2. In the same way, if the second data voltage VD2 is applied to the first and second data lines 201a, 201b, electrons are injected from the first and second data lines 201a, 201b to the first and second storage nodes 120b', 120b". As a result, the data of a high level (logic "1") is stored into the first and second program transistors TR1, TR2.

In the embodiments of the present invention, if the threshold voltage of the program transistors TR1, TR2 is 1.5 V, the program voltage Vp may be 3 V, and the first and second data line voltages VD1, VD2 may be 3 V and −3 V respectively.

As a result, four different states can be stored in one unit cell according to the embodiments of the present invention.

A read operation for selectively reading the data stored in any one of the first and second program transistors TR1, TR2 can be accomplished by applying an appropriate sensing voltage Vs between the source region 171s' and the drain region 171d', and by applying a read voltage Vr to the word line 210. The read voltage Vr must be lower than a first threshold voltage of the sensing transistor programmed such that the storage nodes 120b', 120b" have electrons, and must be higher than a second threshold voltage of the sensing transistor programmed such that the storage nodes 120b', 120b" have holes. For example, in the case that the first threshold voltage is higher than 1.5 V and the second threshold voltage is lower than 0.5 V, the read voltage Vr may be 1.0 V. Further, the sensing voltage Vs is preferably higher than the read voltage Vr.

In the embodiments of the present invention, in order to selectively read the data stored in the first program transistor TR1, that is, the first storage node 120b', the source region 171s' adjacent to the first program transistor TR1 is grounded, and the read voltage Vr and the sensing voltage Vs may be applied to the word line 210 and the drain region 171d' respectively. In this case, a sensing current flowing through the channel region between the source region 171s' and the drain region 171d' is determined by the kind of the charges stored in the first storage node 120b' adjacent to the source region 171s'. That is, in the case that holes are stored in the first storage node 120b', the sensing transistor is turned on even though electrons are stored in the second storage node 120b". This is because the sensing transistor operates in a saturation mode having a channel structure of a pinch-off state. As a result, the bit line voltage induced to the drain region 171d' is decreased, and the unit cell is recognized to have the data corresponding to the low level (logic "0"). On the contrary, in the case that electrons are stored in the first storage node 120b', since any n-channel is not formed below the first storage node 120b', the sensing transistor is turned off. As a result, the bit line voltage induced to the drain region 171d' is increased, and the unit cell is recognized to have the data corresponding to the high level (logic "1").

In the meantime, in order to selectively read the data stored in the second program transistor TR2, that is, the second storage node 120b", the drain region 171d' adjacent to the second program transistor TR2 is grounded, and the read voltage Vr and the sensing voltage Vs can be applied to the word line 210 and the source region 171s'. In this case, the sensing current flowing through the channel region between the source region 171s' and the drain region 171d' is determined by the kind of the charges stored in the second storage node 120b" adjacent to the drain region 171d'. That is, in the case that holes are stored in the second storage node 120b", the sensing transistor is turned on. As a result, the bit line voltage induced to the source region 171s' is decreased, and the unit cell is recognized to have the data corresponding to the low level (logic "0"). On the contrary, in the case that electrons are stored in the second storage node 120b", the sensing transistor is turned off. As a result, the bit line voltage induced to the source region 171s' is increased, and the unit cell is recognized to have the data corresponding to the high level (logic "1").

As described above, according to the embodiments of the present invention, one pair of program transistors sharing one sensing transistor are disposed per unit cell of a semiconductor device. Therefore, the high integration of a semiconductor memory device can be accomplished. Further, a channel length can be lengthened as much as the distance of the one pair of program transistors spaced from each other, thereby improving a short channel effect. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device having a plurality of unit cells, each unit cell comprising:
   a semiconductor substrate;
   a source region and a drain region in the semiconductor substrate and spaced from each other;
   first and second data lines disposed to run across and over a single channel region between the source and drain regions, and disposed adjacent to the source and drain regions, respectively;
   a first multiple tunnel junction (MTJ) barrier layer pattern disposed between the first data line and the channel region;
   a second MTJ barrier layer pattern disposed between the second data line and the channel region;
   a first floated storage node disposed between the first MTJ barrier layer pattern and the channel region;
   a second floated storage node disposed between the second MTJ barrier layer pattern and the channel region; and
   a word line disposed to run across and over the first and second data lines, and disposed to cover both sidewalls of the first and second MTJ barrier layer patterns and both sidewalls of the first and second storage nodes.

2. The semiconductor memory device according to claim 1, wherein each of the first and second MTJ barrier layer patterns comprises alternately stacked semiconductor and insulating layers.

3. The semiconductor memory device according to claim 1, wherein each of the first and second data lines includes a lower conductive layer and an upper conductive layer having a resistivity lower than that of the lower conductive layer.

4. The semiconductor memory device according to claim 1, further comprising a gate insulating layer, which is interposed between the word line and each sidewall of the first and second data lines, the first and second MTJ barrier layer patterns and the first and second floated storage nodes.

5. The semiconductor memory device according to claim 1, wherein the word line together with the first and second floated storage nodes, the first and second MTJ barrier layer patterns, and the first and second data lines operate as one pair of vertical program transistors.

6. The semiconductor memory device according claims 5, wherein the one pair of program transistors are disposed on the sensing transistor.

7. The semiconductor memory device according to claim 5, wherein the first and second floated storage nodes function as a gate electrode of the sensing transistor and concurrently function as a drain region of the program transistors.

8. The semiconductor memory device according to claim 1, wherein the source/drain regions in the semiconductor substrate and the first and second floated storage nodes disposed on the channel region between the source/drain regions operate as one planar sensing transistor.

9. The semiconductor memory device according claims 8, wherein the one pair of program transistors are disposed on the sensing transistor.

10. The semiconductor memory device according to claim 8, wherein the first and second floated storage nodes function as a gate electrode of the sensing transistor and concurrently function as a drain region of the program transistors.

* * * * *